United States Patent [19]

Gerlach

[11] 4,323,855
[45] Apr. 6, 1982

[54] MIC COMBINER USING UNMATCHED DIODES

[75] Inventor: Horst W. A. Gerlach, Bethesda, Md.

[73] Assignee: The United States of America as represented by the Secretary of the Army, Washington, D.C.

[21] Appl. No.: 138,477

[22] Filed: Apr. 9, 1980

[51] Int. Cl.³ .................... H03B 7/14; H03B 9/14; H01P 7/08
[52] U.S. Cl. .................................. 331/56; 331/99; 331/107 P; 331/107 SL; 333/128; 333/219; 333/247
[58] Field of Search ............. 331/56, 96, 99, 100, 331/107 P, 107 SL, 117 D; 333/219, 238, 246, 247, 128

[56] References Cited

U.S. PATENT DOCUMENTS

| 3,952,262 | 4/1976 | Jamison | 331/107 SL X |
| 4,185,252 | 1/1980 | Gerlach | 331/107 P X |
| 4,264,881 | 4/1981 | De Ronde | 331/107 SL X |

FOREIGN PATENT DOCUMENTS 55-79508  6/1980  Japan ..................... 331/107 SL Primary Examiner—Siegfried H. Grimm
Attorney, Agent, or Firm—Nathan Edelberg; Robert P. Gibson; Saul Elbaum

[57] ABSTRACT

In a microstrip circuit having dual diode driven, independently oscillating, half-wave open ring resonating sections, partially coupled quarter-wave ring sections are provided to permit matching and tuning of diodes having dissimilar negative impedances. The quarter wave ring sections are combined with appropriate line sections to accommodate the negative impedance devices. The diode circuits are connected to the low impedance points of the oscillating ring sections by the quarter-wave ring sections. Appropriate terminations to ground are provided to suppress possible oscillations in a bias circuit. Second and third harmonic traps are provided for use with TRAPATT diodes. Ground lines are provided to reduce circuit unbalance in the event of drastic power changes occuring on either side of the circuit which may other wise result in odd mode operation. Slots are provided to suppress an undesired transverse resonance mode in the line sections accommodating the negative impedance devices.

16 Claims, 3 Drawing Figures

MIC COMBINER USING UNMATCHED DIODES

RIGHTS OF THE GOVERNMENT

The invention described herein may be manufactured, used, and licensed by or for the United States Government for governmental purposes without the payment to me of any royalty thereon.

BACKGROUND OF THE INVENTION

1. Field of the Invention

The present invention pertains to microwave integrated circuit (MIC) open ring-resonator oscillator-combiners using negative impedance diodes, and more particularly to such MIC devices having reduced sensitivity to mismatches between the active negative impedance driving devices.

2. Description of the Prior Art

In a prior U.S. patent application, Ser. No. 904,698, filed May 10, 1978, now U.S. Pat. No. 4,185,252, and incorporated herein by reference, the present inventor discloses a Microwave Integrated Circuit (MIC) Open Ring-Resonator Oscillator Combiner (Dual Oscillator) oscillating in the even mode. Such an oscillator improves over the prior art by simplifying the required circuitry, enhancing efficiency of operation, reducing losses, simplifying tuning and providing a graceful degradation backup capability.

In order to achieve synchronous operation, i.e., to operate with signals equal in phase and amplitude, the above referenced disclosed circuit requires the utilization of matched pairs of diodes.

The present invention further improves over the prior art and the referenced application by providing a circuit enabling the use of diodes having dissimilar impedances in an even mode, dual ring oscillator.

SUMMARY AND OBJECTS OF THE INVENTION

It is accordingly an object of the present invention to provide a new and useful MIC Open Ring-Resonator Oscillator Combiner (MICORROC) overcoming the disadvantages of the prior art.

It is a more specific object of the invention to provide a novel MICORROC which utilizes unmatched negative impedance driving devices.

Still a further object of the invention is the provision of partially coupled, quarter-wave ring sections for matching and tuning of diodes having dissimilar negative impedances to an MICORROC.

Yet another object is to provide a MICORROC having line sections accommodating negative impedance devices.

It is a further object to provide a connection of negative impedance diode circuits to the low impedance points of oscillating ring sections of a MICORROC by quarter-wave sections.

Another object of the invention is to provide appropriate ground terminations in a MICORROC in order to suppress possible bias circuit oscillations.

Still another object is the provision of means for conducting heat from diodes used in a MICORROC, and preferrably for conducting such heat to ground.

It is yet another object of the invention to provide means for reducing circuit unbalance in a MICORROC in the event of drastic power changes occurring in either side of a symmetric circuit which might otherwise result in odd mode operation.

Still another object is the provision of a plurality of tuning means for eliminating mismatches between diodes used in a MICORROC.

A further object of the invention is the provision of harmonic traps for a MICORROC using unmatched TRAPAT diodes.

It is still a further object of the invention to provide parallel impedance transformations in a MICORROC using unmatched TRAPPATT diodes.

Yet a further object is the provision of means for suppressing an undesired transverse resonance mode in a diode circuit of a MICORROC.

Another object is the provision of a wideband impedance match from a MICORROC to an output load.

Still another object is the use of an exponential, or tapered line section to provide a wideband impedance match between an output load and a microstrip oscillator.

The present invention accordingly provides circuitry for decoupling and substantially independently tuning first and second open ring microstrip resonator lines, formed substantially in a semi-circular orientation. Decoupling is provided by a coupling circuit including substantially circularly shaped quarter-wave sections to connect the resonant circuits including negative-impedance devices to the resonator lines. Independent tuning capacitors are provided in each resonant section, and ground planes are provided between the resonant sections to isolate the same in the event of unsymmetrical failures. The quarter-wave sections couple the resonant circuits to central points of the half-wave resonator lines, and terminations are provided thereat to prevent parasitic oscillations.

The output section includes a double-transformation strip, having substantially symmetric sections isolated by a further ground plane. Second and third harmonic wave traps are provided in a circuit driven by TRAPATT diodes.

In an alternate embodiment of the invention, a wideband match is provided to the output load by using exponentially tapered output lines.

According to still a further embodiment of the invention, slots are provided in the impedance matching microstrips of the resonant circuits in order to interrupt flow of circulating current and thus to eliminate a parasitic mode of oscillation.

BRIEF DESCRIPTION OF THE DRAWING

The foregoing and other objects, features and advantages of the present invention will become more apparent from the following specification and appended claims when considered in conjunction with the accompanying drawing wherein:

DETAILED DESCRIPTION OF A PREFERRED EMBODIMENT

Figure 1:
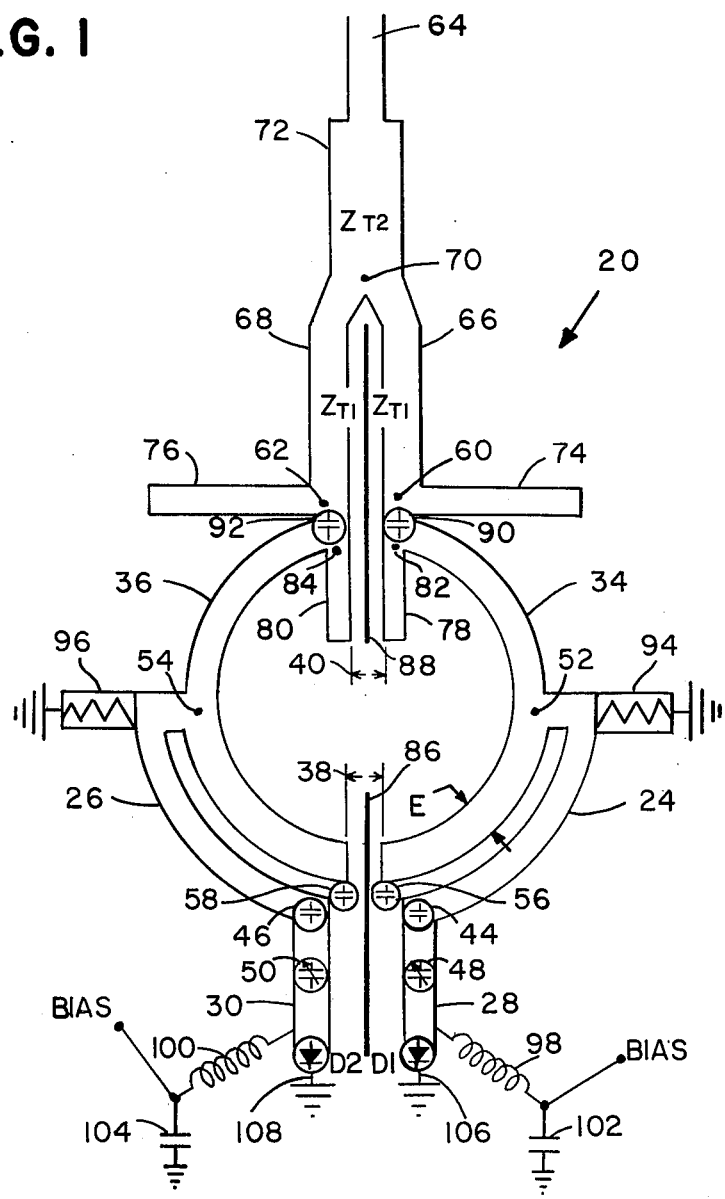
FIG. 1 is a view of a preferred embodiment of a MICORROC in accordance with the present invention.

As further background to the present disclosure, typical MIC's are disposed in a planar fashion as is known in the art. The circuits are generally connected between a diode and a load, the diodes having negative-impedance characteristics. Typically useful diodes in such circuits are TRAPATT diodes, IMPATT diodes, and TED (Transferred Electron Devices), or Gunn devices.

The present invention, by providing a means for decoupling a pair of externally excited resonant lines, permits use of substantially unmatched negative impedance devices of the types enumerated above.

As described in the application filed May 10, 1978, operation of the MIC's wherein the lines are both excited by signals having the same amplitude and phase results in decoupling of the lines. That is, no electric or magnetic field lines couple the two lines to each other. Operation with excitations having the same amplitude but opposite phase results in odd mode, or coupled operation wherein field coupling of the two lines exists. In the decoupled, or even mode of operation, symmetric field lines between the resonant lines and ground assure that no field coupling exists between the lines themselves.

An important objective of the present invention is to decouple the lines in the even mode, and almost decouple the odd mode of operation. This objective is achieved in the MIC of FIG. 1 as follows.

In the Figure, a MICORROC according to the invention is generally shown at 20, and is mounted on a ground plane (not shown). The resonator 20 includes dual oscillating ring sections 24 and 26, each connected to and being driven by an active, negative-impedance element as outlined above. The diodes D1 and D2 are connected to ring sections 24 and 26, respectively, by resonant circuits comprised of microstrip line section 28 and strip ring segment 34 on the one hand, and line section 30 and strip ring segment 36 on the other.

A standard gap 38 is provided between the ends of strip rings 34 and 36. An additional gap 40 is provided between the other ends of the rings in order to promote even mode operation of the resonator 20. Gap 40 provides some decoupling between the ring sections to enable independent oscillation thereof. Line sections 28 and 30 preferably have characteristic impedances selected for matching and accommodating the diodes D1 and D2. The diode line sections are dc-wise separated from strip rings 24, 26, 34 and 36 by bypass capacitors 44 and 46, respectively. Tuning capacitors 48 and 50 are provided between line segments 28 and 30, respectively, and ground.

The lack of criticality of matching characteristics of diodes D1 and D2 may now be explained. With tuning capacitors 48 and 50, adjustments may be provided in the resonant circuit comprising the capacitors, the diodes and the strip lines. The adjustments may be independently made, so that capacitor 48 may adjust the resonant circuit comprising capacitor 48, line 28 and D1 to oscillate at the same frequency as the resonant circuit comprising capacitor 50, line 30 and diode D2. Thus the tuning capacitors permit independent frequency adjustments of the two symmetric sections even with non matched diodes.

The oscillating signal generated in the resonant circuit is then coupled by a coupling circuit to the strip rings. Thus, a coupling circuit comprising ring section 24 couples the signal from resonant circuitry comprising line section 28, diode D1 and tuning capacitor 48 to strip ring 34, while the coupling circuit comprising ring section 26 couples the signal from resonant circuit having line section 30, diode D2 and tuning capacitor 50 to strip ring 36.

The bypass capacitors 44 and 46 are effectively short circuits at the RF frequencies involved, and sections 24 and 26 are selected to be quarter-wave sections.

The quarter-wavelength sections 24 and 26 are at their low impedance points at points 52 and 54, respectively, and at their high impedance levels at the point of coupling to capacitors 44 and 46. The impedance of the diodes and their associated resonant circuits are thus the only impedance coupled by coupling capacitors 56, 58 to rings 34, 36. To obtain proper matching with the load, a particular impedance is desired to be seen at points 60 and 62. Inasmuch as ring sections 34 and 36 are half-wave sections, the impedances seen at points 60 and 62 are substantially the same as that observed at capacitors 56 and 58. The coupling capacitors are thus selected to transform the impedance levels which are desired at points 60, 62.

A double impedance transformation occurs between points 60, 62 and the load at point 64. A first transformation is obtained by a quarter-wave section 66, and a corresponding first transformation provided by quarter-wave section 68. The impedance transformer Zt1, including sections 66 and 68 thus converts the impedance at points 60, 62 to a first value at point 70. This value is substantially one-half the impedance transformed by either section 66 or 68 alone, inasmuch the transformed impedances are essentially equal and are in parallel with each other. The 'first value' of impedance seen at point 70 is, in turn, transformed by a further quarter-wave section 72 to the load impedance at 64.

As is known in the art, second and third harmonic wave traps are required in the event that diodes D1 and D2 are TRAPATT diodes. Indeed, a second harmonic trap is shown at 74, and a symmetric trap is shown at 76. The traps comprise open-ended quarter-wavelength sections connected to sections 66, 68 at points 60, 62, respectively. Sections 74, 76 act as traps when in resonance. Similarly, additional open-ended quarter-wavelength sections 78 and 80 are connected at points 82 and 84 to sections 34 and 36. In the event that Gunn diodes or IMPATT devices are used, rather than TRAPATT diodes, sections 74, 76, 78 and 80 are not used.

In order to provide further shielding between the symmetric sections of the resonator, ground surfaces 86 and 88 are provided. In the absence of such shielding, failure of a diode, whether by short or open circuit, results in a far different impedance being seen at the coupling capacitors 56 and 58, inasmuch one capacitor is viewing an operative diode and the other a non-functioning device. For example, if diode D1 fails in an open circuit mode, or if capacitor 44 opens, a high impedance is seen by capacitor 56, while a reduced impedance is seen in the event of a short circuit failure. In the absence of the shield, such impedance is coupled to, and affects operation of, the symmetric circuit. Since section 34 is a half-wave section, a similar impedance mismatch occurs at point 60. Ground line 86 prevents such coupling at capacitors 56 and 58, while ground line 88 prevents mismatch coupling at points 60 and 62.

As previously described, impedance matching in the present resonator is achieved by the use of tuning capacitors 48 and 50 and coupling capacitors 56 and 58. However, it is possible that a mismatch might still occur at points 60, 62. Accordingly, tuning capacitors 90 and 92 are provided at those points to correct for any minor mismatches existing thereat.

In order to prevent parasitic oscillations, terminations 94 and 96 are provided at points 52 and 54. The terminations provide an impedance matching the characteristic impedance of ring sections 24, 26 and connected to ground. The use of such terminations is particularly applicable to elimination or suppression of possible bias circuit oscillations. A choke circuit 98, 100 is used to introduce bias voltages to the diodes. The chokes, together with filter capacitors 102, 104, form RF filters. A quarter-wavelength line is provided to insure that only a high impedance is coupled to the circuit, in order not to affect its RF performance. The filter capacitors 102 and 104 bypass any RF signals from the bias supply to ground.

In still another feature of the invention, diodes D1 and D2 are heatsinked, and connected to ground at points 106, 108.

In order to obtain the desired isolation with the aid of ground lines 86 and 88, it is preferable that these lines extend upwardly from the plane of the circuit by an amount equal to approximately one half the width E of ring sections 34, 36. Because of the loading provided at the output end of rings 34 and 36, the impedance seen at the coupling points thereof is approximately one-quarter of the impedance at the coupling point of the bypass capacitor. Accordingly, the coupling capacitors 56 and 58 are used to bring the impedance up to the level of the resonant circuit. Further, since capacitors 90 and 92 are meant to compensate for only small differences, the required capacity thereof is approximately one-fifth of that of capacitors 56 and 58. Capacitors 48 and 50, however, typically include at least one-half of the junction capacitance of the associated diode, under reverse bias conditions. Since line sections 28 and 30 are capacitively loaded both by the diode and the tuning capacitors 48, 50, the sections are foreshortened quarter-wavelength sections. That is, they operate as electrical quarter-wavelength lines, but are geometrically somewhat shorter than that.

The preceeding numerical examples are, of course, merely an illustration of typical relationships which may exist between several of the parameters used in the disclosed circuit, and are not to be taken as limitations of the invention.

Figure 2:
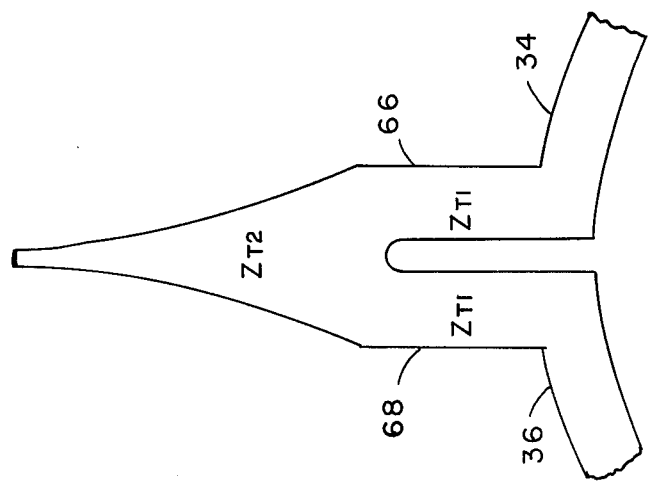
FIG. 2 illustrates an alternate embodiment of one section of the circuit of FIG. 1.

Referring now to FIG. 2, a modification of the circuit of FIG. 1 is shown in the impedance transformation occurring at point 70. Specifically, while the embodiment of FIG. 1 shows a step transformer, an exponentially tapered line is used in FIG. 2 to provide a wideband match to the output load. In this embodiment, line sections 28 and 30 may be wider than in FIG. 1, in order to provide the low impedance match between the diodes and ring sections 24 and 26.

Figure 3:
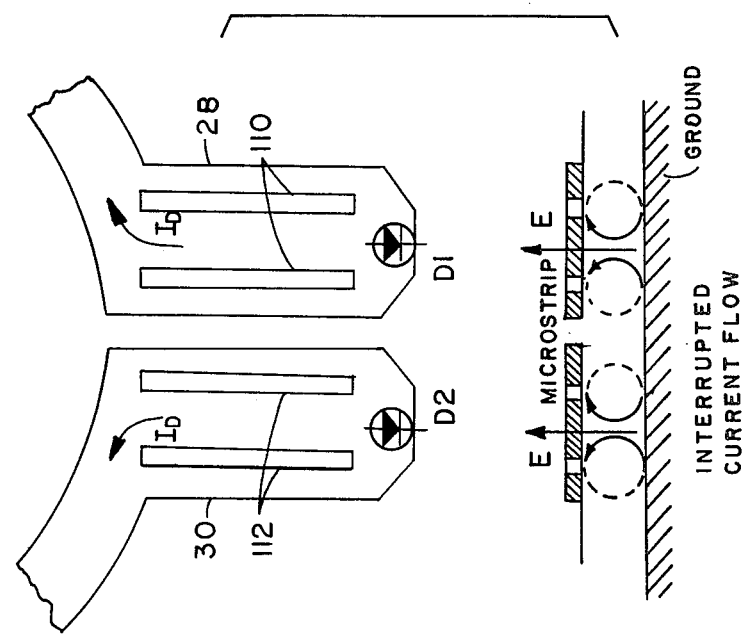
FIG. 3 shows a detail of yet another embodiment of the invention.

With reference to FIG. 3, a displacement current $I_D$ is shown flowing in line sections 28, 30. If the sections are sufficiently wide, however, a transverse "resonance" excitation may result at the operating frequency. Such parasitic resonance may occur in a waveguide mode, below the widened lines. To eliminate such circulating current flow, slots may be provided longitudinally with respect to the line sections in order to interrupt the current. In the figure, the diodes D1 and D2 are positioned under the line sections.

Finally, it is noted that for easier layout of the resonator, terminations 94 and 96 may be provided with a DC isolation from sections 24, 26, and may extend upwardly from the sections rather than to the right and left, as shown in FIG. 1.

I wish it to be understood that I do not desire to be limited to the exact details of construction shown and described for obvious modifications can be made by a person skilled in the art.

I claim:

1. A microstrip circuit having microstrip resonator means for oscillation in an even mode including:
   (a) first and second microstrip resonator sections adapted to oscillate independently from one another;
   (b) each of said first and second resonator sections having first and second ends;
   (c) said resonator sections disposed in respective opposition to each other;
   (d) first and second active elements;
   (e) means for connecting said active elements to said first and second resonator sections;
   (f) impedance transforming means connected between said second ends and a load, and
   (g) means for decoupling said resonator sections from each other, comprising:
   (h) first and second microstrip connecting lines including first and second tuning capacitors, said connecting lines coupled to said active elements, and
   (i) first and second decoupling microstrip connectors each coupled to one of said first and second connecting lines, respectively, at its one end, and to said first and second resonator sections, respectively, at its other end.

2. The microstrip circuit of claim 1 wherein said active elements comprise negative impedance elements.

3. The microstrip circuit of claim 2 wherein said first and second resonator sections comprise substantially circular halfwave ring sections, said first and second ends of which are separated by predetermined gaps in respective opposition, and wherein said first and second decoupling connectors comprise substantially circular quarter-wave ring segments, said quarter-wave ring segments having high and low impedance ends, said first and second decoupling connectors coupled to said first and second resonator sections at their low impedance ends.

4. The microstrip circuit of claim 3 wherein said microstrip connecting lines comprise foreshortened quarter-wave lines.

5. The microstrip circuit of claim 3 further comprising first and second bypass capacitor means connecting said first and second quarter wave ring segments to said first and second connecting lines.

6. The microstrip circuit of claim 5 further comprising first and second coupling capacitors connected between said first ends of said first and second half wave ring sections and said high impedance ends of said quarter wave ring segments.

7. The microstrip circuit of claim 3 further comprising ground means interposed within said gaps formed between said half wave ring sections for preventing odd modes of oscillation in the presence of strong unbalance between the resonating sections.

8. The microstrip circuit of claim 3 further comprising resistive terminations to ground at said low impedance ends of said quarter wave connector ring segments.

9. The microstrip circuit of claim 3 wherein said negative impedance elements comprise TRAPATT devices and further comprising second and third harmonic traps at the second ends of said half wave resonator ring sections.

10. The microstrip circuit of claim 9 wherein said second and third harmonic traps each comprise first and second open quarter wave sections.

11. The microstrip circuit of claim 3 further comprising RF choke means for connecting a bias source to said negative impedance elements.

12. The microstrip circuit of claim 3 wherein said impedance transforming means comprises first and second impedance transformers, said first transformer comprising a pair of quarter wave line sections connected at their first ends to said second ends of said half wave ring sections, and at their other ends to a common point, said second impedance transformer comprising a further quarter wave line section connected between said common point and a load.

13. The microstrip circuit of claim 12 wherein said second impedance transformer comprises a step transformer.

14. The microstrip circuit of claim 12 wherein said second impedance transformer comprises tapered sides.

15. The microstrip circuit of claim 3 wherein said first and second microstrip connecting lines comprise suppressing means for suppressing parasitic resonance.

16. The microstrip circuit of claim 15 wherein said suppressing means comprise longitudinal slots formed in each of said connecting lines for interrupting flow of circulating currents therein.

* * * * *